United States Patent
Nickerson et al.

(10) Patent No.: US 9,691,728 B2
(45) Date of Patent: Jun. 27, 2017

(54) BBUL TOP SIDE SUBSTRATE LAYER ENABLING DUAL SIDED SILICON INTERCONNECT AND STACKING FLEXIBILITY

(71) Applicant: INTEL CORPORATION, Santa Clara, CA (US)

(72) Inventors: Robert M. Nickerson, Chandler, AZ (US); Min Tao, Chandler, AZ (US); John S. Guzek, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/629,350

(22) Filed: Feb. 23, 2015

(65) Prior Publication Data
US 2015/0171044 A1 Jun. 18, 2015

Related U.S. Application Data

(63) Continuation of application No. 13/976,394, filed as application No. PCT/US2011/068277 on Dec. 31, 2011, now abandoned.

(51) Int. Cl.
*H01L 23/52* (2006.01)
*H01L 29/24* (2006.01)
*H01L 23/48* (2006.01)
*H01L 23/49* (2006.01)
(Continued)

(52) U.S. Cl.
CPC .......... *H01L 24/19* (2013.01); *H01L 23/4985* (2013.01); *H01L 23/49822* (2013.01);
(Continued)

(58) Field of Classification Search
CPC ......... H01L 24/19; H01L 25/18; H01L 24/06; H01L 23/49838; H01L 24/03; H01L 24/73; H01L 24/92; H01L 23/4985; H05K 1/185
(Continued)

(56) References Cited

U.S. PATENT DOCUMENTS 8,063,493 B2    11/2011    Boon et al.
2007/0090517 A1*    4/2007    Moon ................. H01L 23/3128
                                                257/706
(Continued)

OTHER PUBLICATIONS

Intel Corporation, et al., PCT International Search Report and Written Opinion mailed Sep. 27, 2012 for PCT/US2011/068277.
(Continued)

*Primary Examiner* — John C Ingham
*Assistant Examiner* — Didarul Mazumder
(74) *Attorney, Agent, or Firm* — Blakely, Sokoloff, Taylor & Zafman LLP (57) ABSTRACT

An apparatus including a die including a first side and an opposite second side including a device side with contact points; and a build-up carrier including at least one layer of conductive material disposed on a first side of the die, and a plurality of alternating layers of conductive material and dielectric material disposed on the second side of the die, wherein the at least one layer of conductive material on the first side of the die is coupled to at least one of (1) at least one of the alternating layers of conductive material on the second side of the die and (2) at least one of the contact points of the die. A method including forming a first portion of a build-up carrier adjacent one side of a die, and forming a second portion of the build-up carrier adjacent another side of the die.

5 Claims, 6 Drawing Sheets

(51) Int. Cl.
*H05K 1/18* (2006.01)
*H01L 23/00* (2006.01)
*H05K 3/46* (2006.01)
*H01L 23/498* (2006.01)
*H01L 23/538* (2006.01)
*H01L 25/18* (2006.01)

(52) U.S. Cl.
CPC .... *H01L 23/49838* (2013.01); *H01L 23/5389* (2013.01); *H01L 24/03* (2013.01); *H01L 24/06* (2013.01); *H01L 24/20* (2013.01); *H01L 24/73* (2013.01); *H01L 24/92* (2013.01); *H01L 25/18* (2013.01); *H05K 1/185* (2013.01); *H05K 3/4682* (2013.01); *H01L 24/16* (2013.01); *H01L 2224/0401* (2013.01); *H01L 2224/04105* (2013.01); *H01L 2224/16147* (2013.01); *H01L 2224/16225* (2013.01); *H01L 2224/16227* (2013.01); *H01L 2224/24225* (2013.01); *H01L 2224/73259* (2013.01); *H01L 2224/821* (2013.01); *H01L 2224/92224* (2013.01); *H01L 2224/97* (2013.01); *H01L 2924/00013* (2013.01); *H01L 2924/10253* (2013.01); *H01L 2924/1431* (2013.01); *H01L 2924/1432* (2013.01); *H01L 2924/1434* (2013.01); *H05K 1/186* (2013.01); *H05K 2201/10674* (2013.01); *H05K 2203/1469* (2013.01)

(58) Field of Classification Search
USPC ........................................................ 257/774
See application file for complete search history.

(56) References Cited

U.S. PATENT DOCUMENTS

| | | | |
|---|---|---|---|
| 2008/0116565 A1* | 5/2008 | Hsu | H01L 23/5389 257/699 |
| 2009/0224378 A1* | 9/2009 | Chen | H01L 21/486 257/666 |
| 2010/0002406 A1 | 1/2010 | Hsu | |
| 2011/0221069 A1* | 9/2011 | Kunimoto | H01L 23/5389 257/774 |
| 2011/0278741 A1* | 11/2011 | Chua | H01L 24/19 257/777 |
| 2011/0316140 A1 | 12/2011 | Nalla et al. | |
| 2012/0038053 A1* | 2/2012 | Oh | H05K 1/186 257/773 |
| 2012/0161331 A1* | 6/2012 | Gonzalez | H01L 24/19 257/774 |
| 2013/0069239 A1* | 3/2013 | Kim | H01L 23/49827 257/774 |
| 2013/0075924 A1 | 3/2013 | Lin et al. | |

OTHER PUBLICATIONS

Intel Corporation, International Preliminary Report on Patentability dated Jul. 10, 2014 for PCT/US2011/068277.
Intel Corporation et al., Final Office Action mailed Oct. 23, 2014 for U.S. Appl. No. 13/976,394.

* cited by examiner

BBUL TOP SIDE SUBSTRATE LAYER ENABLING DUAL SIDED SILICON INTERCONNECT AND STACKING FLEXIBILITY

CROSS-REFERENCE TO RELATED APPLICATION

The application is a continuation of co-pending U.S. patent application Ser. No. 13/976,394, filed Jun. 26, 2013, which is a U.S. National Phase Application under 35 U.S.C. §371 of International Patent Application No. PCT/US2011/068277, filed Dec. 31, 2011 and incorporated herein by reference.

BACKGROUND

Field

Packaging for microelectronic devices.

Description of Related Art

Microelectronic packaging technology, including methods to mechanically and electrically attach a silicon die (e.g., a microprocessor) to a substrate or other carrier continues to be refined and improved. Bumpless Build-Up Layer (BBUL) technology is one approach to a packaging architecture. Among its advantages, BBUL eliminates the need for assembly, eliminates prior solder ball interconnections (e.g., flip-chip interconnections), reduces stress on low-k interlayer dielectric of dies due to die-to-substrate coefficient of thermal expansion (CTE mismatch), and reduces package inductance through elimination of core and flip-chip interconnect for improved input/output (I/O) and power delivery performance.

With shrinking electronic device sizes and increasing functionality, integrated circuit packages will need to occupy less space. One way to conserve space is to combine a device or package on top of a package (e.g., package-on-package (POP)). Such combination will require increased connectivity through, for example, routing layers with the die and the package.

One issue that arises with a package, such as a BBUL, is warpage. A BBUL package typically consists of a dielectric material, possibly of a number of films, separating conductive lines or traces of a material such as copper. The package is also typically considerably larger than the die. Accordingly, when combined with a rigid die, the combination including a significantly larger package can experience warpage. Any such warpage may be acceptable in those instances where the combination of die and package constitute a complete structure.

DETAILED DESCRIPTION

Figure 1:
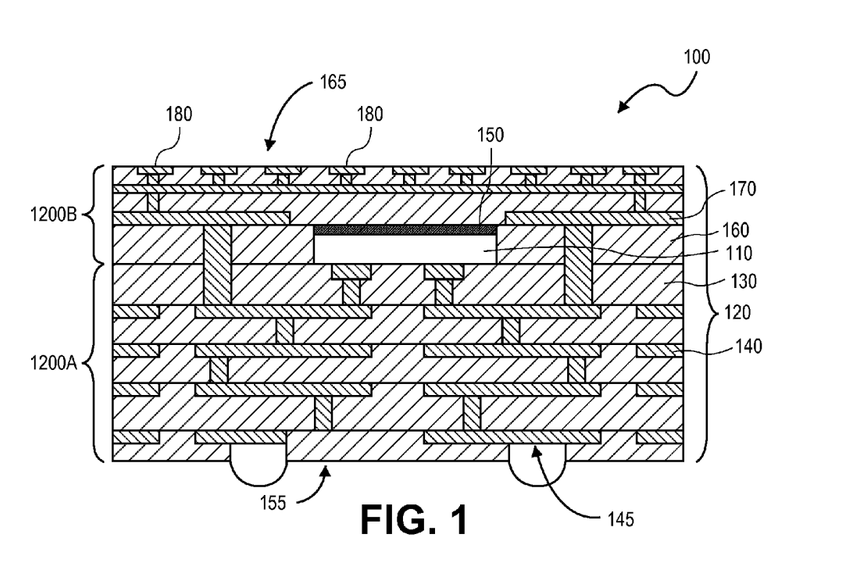
FIG. 1 shows a cross-sectional view one embodiment of a portion of a microelectronic package including a non-through silicon via die embedded in a build-up carrier.

FIG. 1 shows a cross-sectional view of a microelectronic package according to one embodiment. As illustrated in FIG. 1, microelectronic package 100 utilizes bumpless build-up layer (BBUL) technology. Microelectronic package 100 includes carrier 120 and die 110, such as a microprocessor die, embedded in carrier 120 device side down (as viewed). Carrier 120 includes portion 1200A encompassing die 110 and extending from a device side of die 110 and portion 1200B opposite portion 1200A.

In one embodiment, die 110 is a silicon die or the like having a thickness of approximately 150 micrometers (µm). In another example, die 110 can be a silicon die or the like that has a thickness less than 150 µm such as 50 µm to 150 µm. It is appreciated that other thicknesses for die 110 are possible.

Referring to FIG. 1, portion 1200A of carrier 120 includes multiple build-up layers including dielectric layers 130 of, for example, ABF and conductive layers 140 of, for example, copper or a copper alloy (connected with conductive vias or the like) that provide connectivity to the die (power, ground, input/output, etc.) through contacts 145. Die 110 and portion 1200A of carrier 120 are in direct physical contact with each other (e.g., there are no solder bumps connecting die 110 to carrier 120). Die 110 is directly connected to contacts or conductive vias of portion 1200A of carrier 120 at its device side. Surface 155 of portion 1200A opposite die 110, portion 1200 of carrier 120 includes contacts 145. In one embodiment, contacts 145 are suitable for a surface mount packaging implementation (e.g., a ball grid array). As shown in FIG. 1, one of dielectric layers 130 surrounds the lateral side walls of die 110.

Overlying a back side of die 110 of microelectronic package 100 in FIG. 1 is adhesive layer 150 of, for example, a die backside film (DBF) polymer, epoxy based adhesive with or without fillers. Overlying adhesive layer 150 and on portion 1200A of carrier 120 is portion 1200B of carrier 120. Portion 1200B includes additional build-up layers including dielectric layers 160 and conductive layers 170. Dielectric layers 160 (e.g., two or more) may be of a material similar to a material for dielectric layers 130 (e.g., ABF) or a different material. Conductive layers 170 (e.g., one or more) are, for example, a copper or copper alloy material. Conductive layers 170 are connected with conductive vias or the like to one or more conductive layers 140 of portion 1200A of carrier 120.

FIG. 1 also shows contacts 180 on exposed surface 165 of second portion 1200B of carrier 120. Contacts 180 are connected to conductive layers of carrier 120, e.g., conductive layers of portion 1200A of carrier 120. Contacts 180 provide an additional routing opportunity (additional to contacts 145 on portion 1200A of carrier 120) to route signals to or from microelectronic package 100. Contacts 180 may extend over an entire package surface of microelectronic package 100 or some lesser portion of the surface. Contacts 180 allow additional interconnect points for the package as well as contact points for a second device, such as a memory device or microprocessor (possibly encompassed in a package, e.g., package-on-package ("POP")) to be electrically connected to microelectronic package 100.

In addition to providing an additional routing opportunity, the presence of portion 1200B of carrier 120 provides warpage management to the package as the presence of one or more conductive layers and dielectric layers will tend to stiffen the package and inhibit warpage. Further, die 110 will experience reduced stress since it is embedded in carrier 120.

Figure 2:
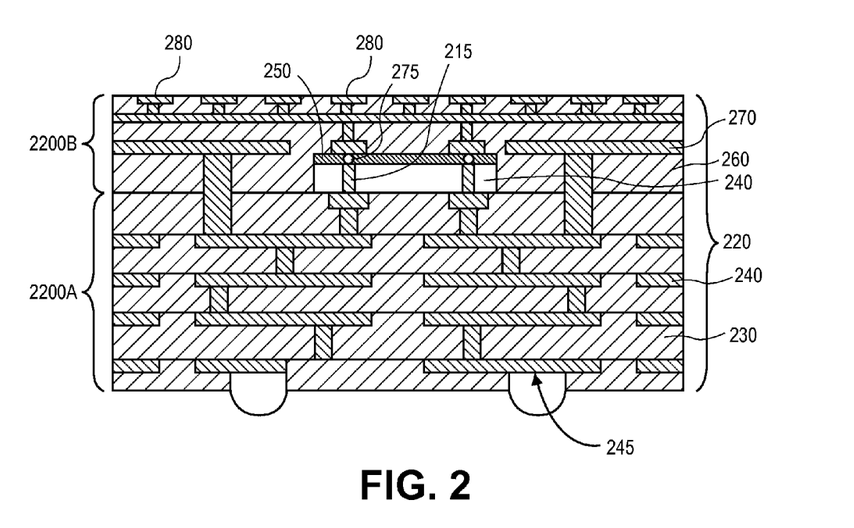
FIG. 2 shows a cross-sectional view another embodiment of a portion of a microelectronic package including a through silicon via die embedded in a build-up carrier.

FIG. 2 shows another embodiment of a microelectronic package that includes a die having through silicon vias (TSVs). FIG. 2 shows microelectronic package 200 including carrier 220 having die 210 embedded therein. Die 210 is embedded device side down (as viewed). Carrier 220 includes portion 2200A encompassing die 210 and extending from a device side of die 210 and portion 2200B opposite portion 2200A. Portion 2200A of carrier 220 includes a number of conductive layers or levels of, for example, copper or a copper alloy, disposed therein and separated by dielectric or insulating layers 230 such as layers of ABF film. The one or more conductive layers are connected to contacts 245 on a surface of portion 2200B opposite die 110. Contacts 245 are suitably, in one embodiment, for a surface mount packaging implementation.

Overlying die 210 as viewed is portion 2200B of carrier 220. Portion 2200B includes one or more layers of conductive layers 270 or levels (e.g., Cu or a Cu alloy) separated from die 210 (a back side of die 210) and from one another by dielectric or insulating material 260 (e.g., ABF).

In the embodiment shown in FIG. 2, die 210 includes through silicon vias (TSVs) 215 extending from a device side through a die culminating in contacts 275 on a back side surface of die 210. FIG. 2 shows that one or more conductive layers 270 are conductively connected with contacts 275 to route signals to/from die 210. FIG. 2 shows solder connections 274 to contacts 275 and patterned conductive layer or line 270. Overlying a back side of die 240 is an adhesive such as DBF that surrounds the solder connections.

FIG. 2 also shows contacts 280 exposed on a surface of portion 220B. Contacts 280 are electrically connected to respective conductive layers in carrier 220, e.g., in portion 2200B on a back side of die 210. Contacts 280 include contacts connected to contacts 275 (by conductive layer/via routing from contacts 275 directly to contact 280). Other of contacts 275 are connected to conductive layers 270 that are connected to conductive layers 240 in portion 2200A of carrier 220 that extend from a device side of die 210. Such conductive vias and possible contacts provide an additional interconnect points for the package as well as contacts points for another die or other device to be connected to die 210.

The embodiments of a microelectronic package described above with respect to FIG. 1 and FIG. 2 integrate one or more additional routing layers and BBUL architecture. The one or more additional routing layers enables dual side connectivity allowing for stacking of one or more devices on the package or package-on-package (POP) configurations. Furthermore, since virtually the entire surface of a package is available for conductive contacts to the package interconnects or the die, the possibilities for positioning of a secondary device or package or multiple devices or package on the packages described with reference to FIG. 1 and FIG. 2 are increased. In addition, the integration enables increased warpage control, especially for large surface area (e.g., on the order of 17×17 mm$^2$) and ultrathin (e.g., less than 150 μm) dies (both TSV and non-TSV dies) where warpage might be more likely. The integration of one or more additional routing layers still further provides warpage control solutions to a package-on-package (POP) BBUL package (e.g., non-TSV die, see FIG. 1) with improved warpage control due to the presence of the one or more routing layers on the die back side. For TSV dies, warpage control solutions are presented that enable both POP and wide I/O stacking (device directly to die).

Figure 3:
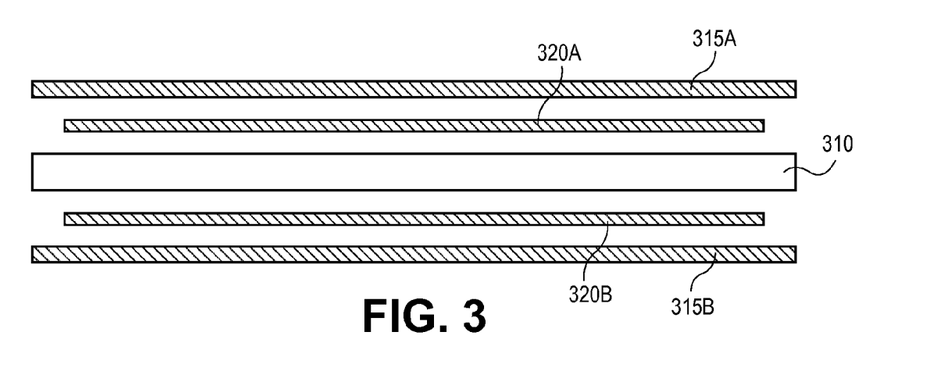
FIG. 3 shows a cross-sectional exploded side view of a sacrificial substrate with sacrificial copper foils attached to opposite sides thereof.

FIGS. 3-9 describe one embodiment for forming a microelectronic package, such as microelectronic package 200 (FIG. 2) with a TSV die. Referring to FIG. 3, FIG. 3 shows an exploded cross-sectional side view of a portion of sacrificial substrate 310 of, for example, a prepeg material including opposing layers of copper foils 315A and 315B that are separated from sacrificial substrate 310 by shorter copper foil layers 320A and 320B, respectively. Copper foils 315A and 315B tend to stick to the shorter foils based on vacuum.

Figure 4:
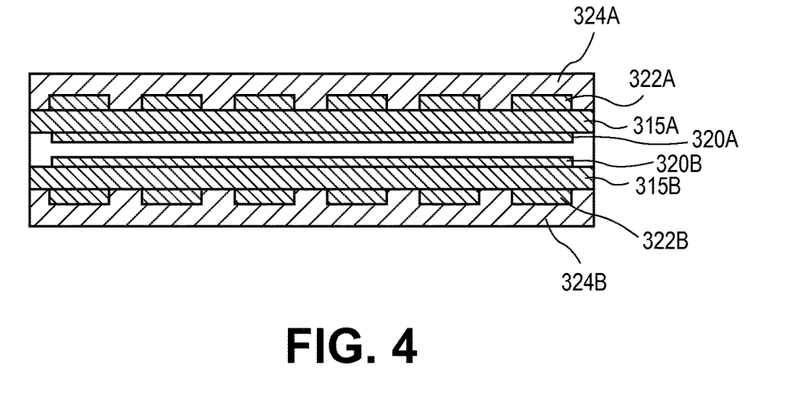
FIG. 4 show the structure of FIG. 3 following the introduction of contacts on the copper foils and a dielectric layer over the contacts in a process of forming one portion of the carrier.

FIG. 4 shows the structure of FIG. 3 following the introduction and patterning of contacts on copper foil 315A and copper foil 315B, respectively. FIG. 4 shows contacts 322A and 322B formed on copper foil 315A and 315B, respectively. In one embodiment, contacts 325A and 325B include a first layer adjacent copper foil 315A and copper foil 315B, respectively, of a gold-nickel alloy and a second layer overlying a second layer of copper or a copper alloy overlying the gold-nickel alloy. Contacts 325A and 325B may be formed by deposition (e.g., plating, a sputter deposition, etc.) and patterning at a desired location for possible electrical contact with a secondary device or package.

FIG. 4 also shows the structure following the introduction of dielectric layer 324A and dielectric layer 324B on opposite sides of the structure. In one embodiment, dielectric layer 324A and dielectric layer 324B are each an ABF dielectric possibly including a filler that have been described for use in forming a BBUL package. One method of introduction of an ABF material is as a film that is laid on the contacts and copper foils.

Figure 5:
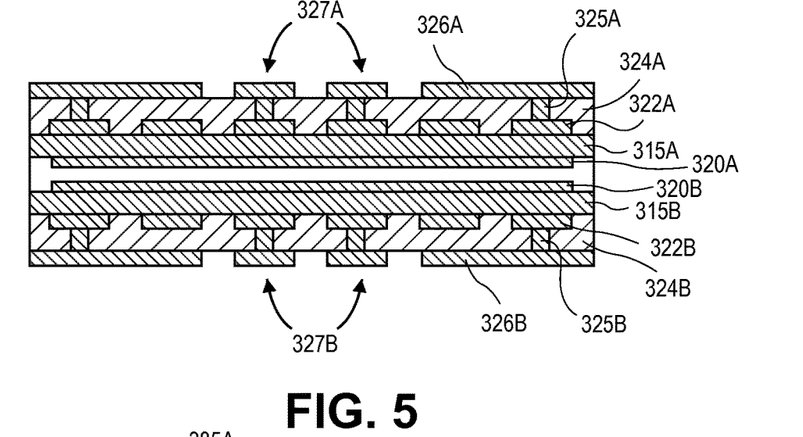
FIG. 5 shows the structure of FIG. 4 following the patterning of conductive vias to contact points and a first conductive layer or line on the dielectric layer in a process of forming one portion of a carrier.

FIG. 5 shows the structure of FIG. 4 following the patterning of vias through dielectric layer 324A and dielectric layer 324B to contacts 322A and 322B and the formation of conductive vias and a conductive layer or line on each of dielectric layer 324A and dielectric layer 324B. Contacts 322A/322B may be exposed and conductive vias formed thereto (through dielectric layer 324/324B). With regard to patterning vias in a material such as ABF, such patterning may be done by, for example, a drilling process. Once the vias are formed, electrical conductor (e.g., copper metal) patterning may be done in order to fill the vias and pattern conductive layer or line 326A and 326B on dielectric layer 324A and dielectric layer 324B, respectively, for example, using an electroless seed layer followed by a dry film resist (DFR) patterning and plating. The DFR may then be stripped followed by a flash etch to remove any unwanted electroless seed layer. It is appreciated that other methods are also suitable. FIG. 5 shows vias 325A and 325B filled with conductive material and represented as conductive vias including conductive vias to contact points 327A and 327B, respectively, that will be connected to through silicon vias (TSVs) of respective die that are subsequently connected to the structure.

Figure 6:
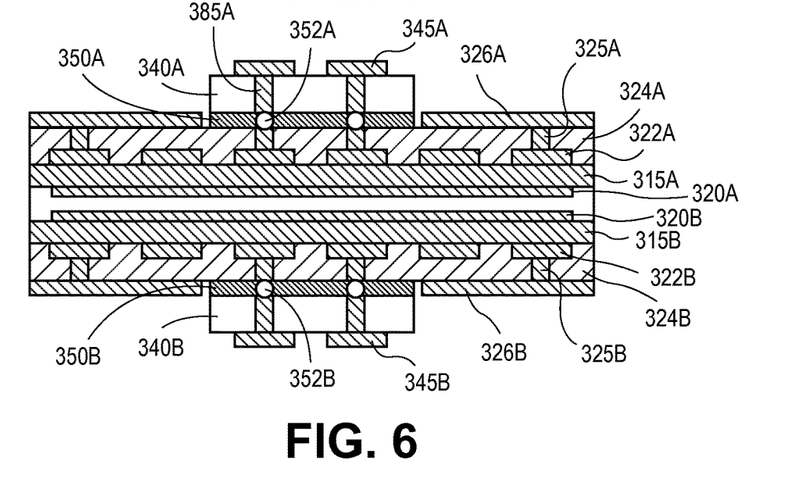
FIG. 6 shows the structure of FIG. 5 following the attachment of die patterning of alternating layers to opposite sides of the structure.

FIG. 6 shows the structure of FIG. 5 following the mounting of die 340A and die 340B on opposite sides of the structure. In this embodiment, die 340A and die 340B are TSV die. As shown in FIG. 6, die 340A is connected by adhesive 350A and die 340B is connected by adhesive 350B. A suitable adhesive material for 350A and adhesive 350B is DBF. Die 340A and die 340B are positioned device side up (device side facing away from each copper foil). FIG. 6 shows each die 340A and die 340B having through substrate vias 385A and 385V, respectively, from a device side to a back side of the die. Vias 385A and vias 385B are connected to contacts 327A and contacts 327B through, for example, solder connections 352A and 352B. On a device side of each die, FIG. 6 shows that conductive pillars 345A and 345B are connected to the contact points die 340A and die 340B, respectively. Pillars 345A and pillars 345B may be fabricated at the die fabrication stage.

Figure 7:
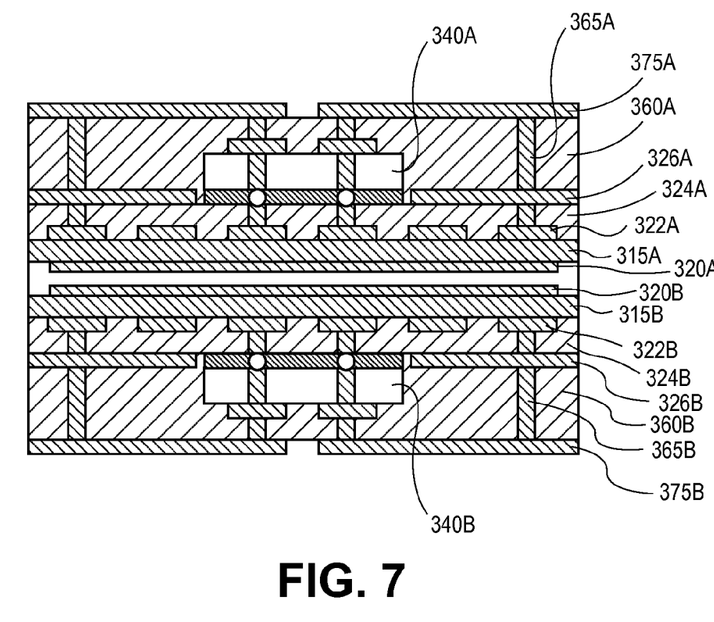
FIG. 7 shows the structure of FIG. 6 following the introduction of a dielectric layer over the die, the formation of vias in the dielectric layer and the introduction of a conductive material in the vias and the patterning of a conductive layer or line on the dielectric.

FIG. 7 shows the structure of FIG. 6 following the introduction of a dielectric layer on each side of the structure. FIG. 7 shows dielectric layer 360A and dielectric layer 360B each of, for example, an ABF material introduced as a film. FIG. 7 also shows the patterning of a conductive line or layer 375A and conductive line or layer 375B on dielectric layer 360A and dielectric layer 360B, respectively, and conductive vias 365A and 365B formed through the respective dielectric layers to conductive layer 326A and conductive layer 326B. Conductive vias are also formed to pillars 345A and pillars 345B to contact points on a device side of die 340A and die 340Ab. A suitable material for patterned conductive line or layer 375A/375B and for conductive vias 365A/365B is copper deposited, for example, by an electroless process.

Figure 8:
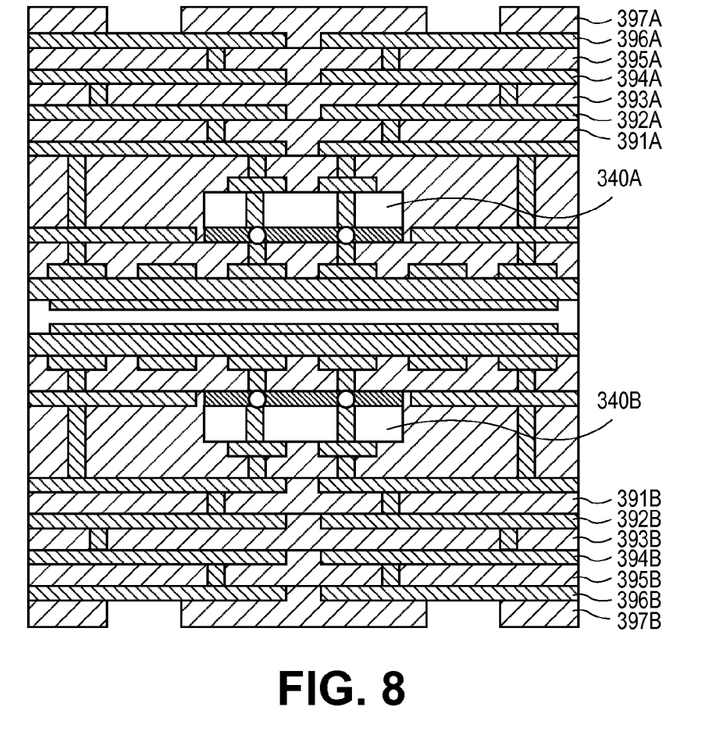
FIG. 8 shows the structure of FIG. 7 following the introduction of successive layers of a dielectric material and patterned the conductive material in a process of forming a second portion of the carrier.

FIG. 8 shows the structure of FIG. 7 following the patterning of additional levels of conductive lines 392A/392B, 394A/394B, and 396A/396B (e.g., three additional levels separated from one another by dielectric layers 391A/391B, 393A/393B, 395A/395B, and 397A/397B (e.g., ABF film)). A typical BBUL package may have four to six levels of conductive lines or traces connected to one another or die 340A/die 340B by conductive vias. A top level is patterned with contacts that are suitable, for example, for a surface mount packaging implementation (e.g., a ball grid array).

Figure 9:
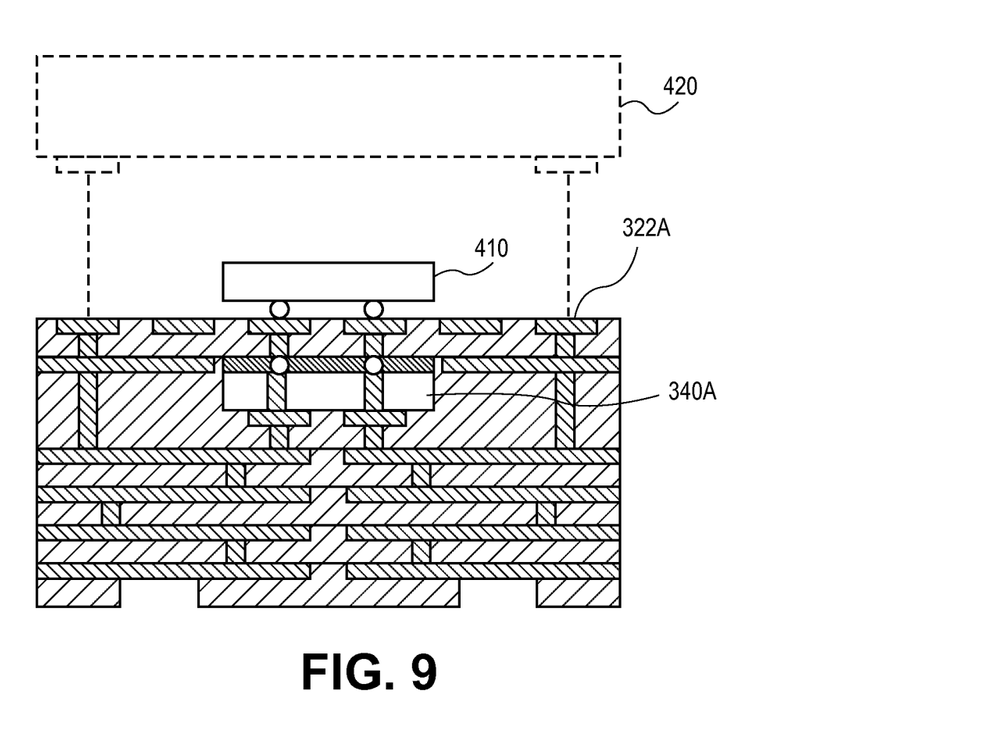
FIG. 9 shows the isolation of one package from the structure of FIG. 8 and the connection of at least one secondary device to the package.

FIG. 9 shows a portion of the structure of FIG. 8 following the separation of the structure into two individual package portions by removal of sacrificial substrate 310 and copper foils 315A and 315B. By removing the individual packages from sacrificial substrate 310, FIG. 9 shows a portion of a free standing microelectronic package that has a TSV die connected at a device side to a first portion of a build-up carrier including a number of alternating layers of electrically conductive material (four levels of conductive traces) and dielectric or insulating material. Contact points of die 340A are, for example, pillars fabricated at the die fabrication process and are connected to the conductive material of the build-up carrier. The package also includes contact points 325A extending to surface 400A for electrical connection to a one or more conductive layers or lines to be formed as part of a second portion of the carrier. Further, die 340A, as a TSV die, includes conductive vias 385A extending from a device die to a backside of the die.

FIG. 9 shows the structure following the connection of a secondary device or package 400 to the now formed microelectronic package (e.g., to die 340A in the now formed package). FIG. 9 shows secondary device 410 that is, for example, a memory or a logic die electrically connected to die 340A through contacts 322A on a backside surface of the package. FIG. 9 also shows that additional device 420, such as a package, can be connected to the formed microelectronic package through contacts 322A. Representatively, a memory package may be aligned over the formed package as connected to contact 425A.

In FIGS. 3-9, a process of forming a microelectronic package including a TSV die was described. It is appreciated that many of the same process operations may be utilized in a microelectronic package with a non-TSV die. One difference is that with a non-TSV die, the back side of the die does not need to be accessed and no conductive vias are formed to the back side of the die.

Figure 10:
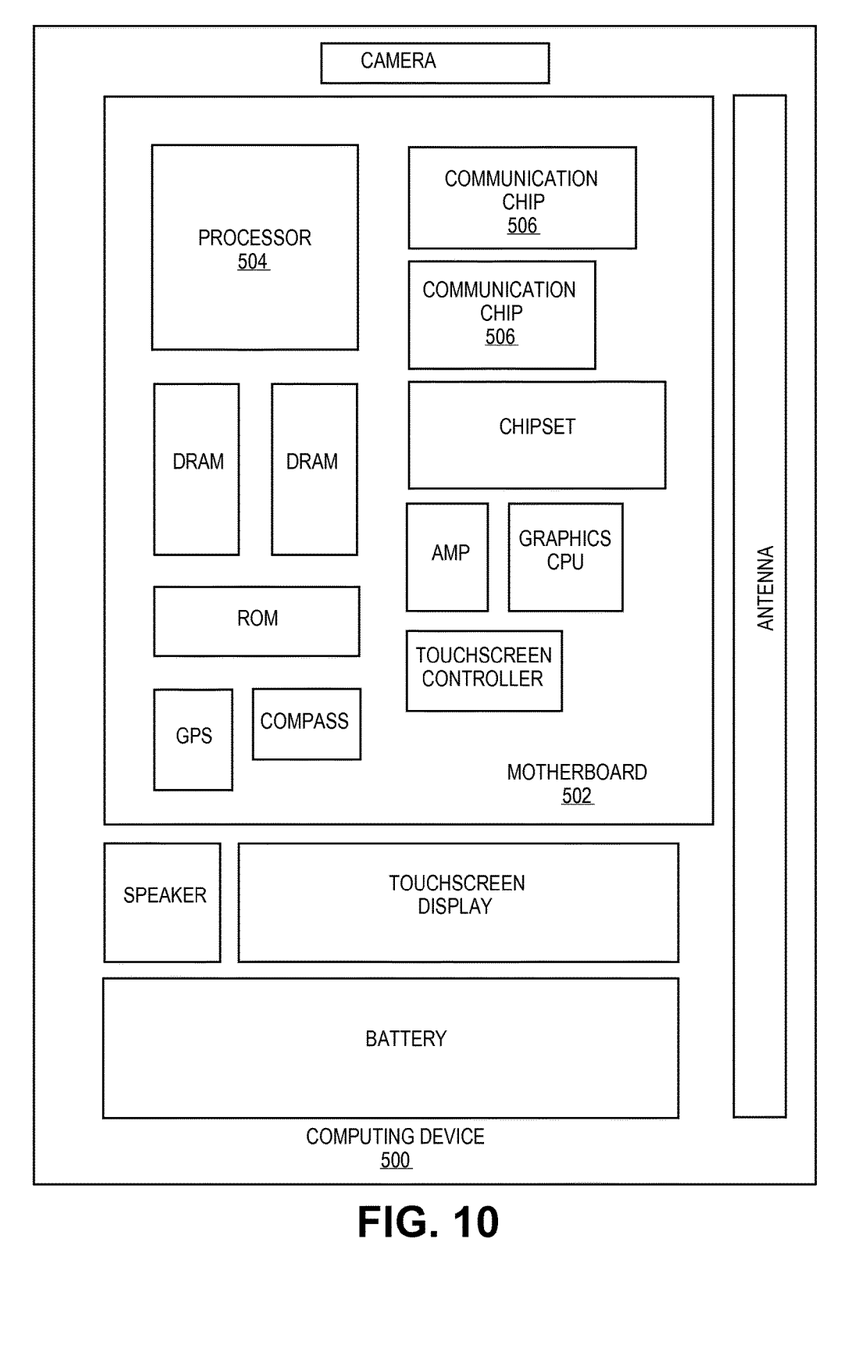
FIG. 10 illustrates a schematic illustration of a computing device.

FIG. 10 illustrates a computing device 500 in accordance with one implementation. Computing device 500 houses board 502. Board 502 may include a number of components, including but not limited to processor 504 and at least one communication chip 506. Processor 504 is physically and electrically coupled to board 502. In some implementations the at least one communication chip 506 is also physically and electrically coupled to board 502. In further implementations, communication chip 506 is part of processor 504.

Depending on its applications, computing device 500 may include other components that may or may not be physically and electrically coupled to board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. In some implementations, the package formed in accordance with embodiment described above utilizes BBUL technology with carrier encapsulating a TSV or non-TSV die that inhibits package warpage and provides one or more routing layers on a back side of the carrier. The term "processor" may refer to any device or portion of a device that processes electronic data from registers and/or memory to transform that electronic data into other electronic data that may be stored in registers and/or memory.

Communication chip 506 also includes an integrated circuit die packaged within communication chip 506. In accordance with another implementation, package is based on BBUL technology and incorporates a primary core surrounding a TSV or non-TSV integrated circuit die that inhibit package warpage. Such packaging will enable stacking of various devices, including but not limited to, a microprocessor chip (die) with a memory die with a graphics die with a chip set with GPS.

In further implementations, another component housed within computing device 600 may contain a microelectronic package incorporates a primary core surrounding a TSV or non-TSV integrated circuit die that inhibits package warpage.

In various implementations, computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

The invention claimed is:

1. A method comprising:
    forming a first portion of a build-up carrier adjacent a second side of a die, the die comprising a first side opposite the second side, wherein the second side of the die comprises a device side with contact points and comprising conductive pillars on the contact points, wherein the first portion of the build-up carrier comprises a plurality of alternating layers of conductive material and dielectric material, wherein at least one of the layers of conductive material is directly coupled to one of the conductive pillars on the contact points of the die;
    forming a second portion of the build-up carrier adjacent the first side of the die, the second portion comprising at least one layer of conductive material and a plurality of contacts,
    wherein forming the second portion of the build-up carrier precedes forming the first portion of the build-up carrier,
    wherein forming the second portion of the build-up carrier comprises:
        forming the plurality of contacts on a sacrificial substrate having a planar surface;
        forming a layer of dielectric material on the plurality of contacts;
        forming the at least one layer of conductive material on the layer of dielectric material so that the dielectric material is between the plurality of contacts and the at least one layer of conductive material; and
        after forming the at least one layer of conductive material of the second portion of the build-up carrier, positioning the die on the at least one layer of conductive material of the second portion of the build-up carrier,
    wherein forming the first portion of the build-up carrier comprises introducing a layer of dielectric material on the die and, after introducing the layer of dielectric material, patterning conductive vias through the dielectric material to the contact points of the die and a layer of conductive material on the dielectric material,
    wherein the at least one layer of conductive material of the second portion is coupled to at least one of the alternating layers of conductive material on the first portion of the carrier, and
    after forming the first portion of the build-up carrier, removing the sacrificial substrate to define the plurality of contact points of the second portion of the build-up carrier as accessible contact points.

2. The method of claim 1, wherein forming the second portion of the build-up carrier comprises separating the at least one layer of conductive material on the first side of the die from the die by a dielectric material.

3. The method of claim 1, further comprising electrically coupling the at least one layer of conductive material on the first side comprises coupling to at least one of the plurality of layers of conductive material on the second side.

4. The method of claim 1, coupling ones of the contact points of the die to the at least one layer of conductive material of the second portion of the build-up carrier.

5. The method of claim 4, wherein the contact points of the die that are coupled to the at least one layer of conductive material are coupled to conductive vias from the second side of the die to the first side.

* * * * *